United States Patent
Yura et al.

(10) Patent No.: US 8,211,328 B2
(45) Date of Patent: *Jul. 3, 2012

(54) CRYSTALLOGRAPHICALLY-ORIENTED CERAMIC

(75) Inventors: Yukinobu Yura, Nagoya (JP);
Nobuyuki Kobayashi, Nagoya (JP);
Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 629 days.

This patent is subject to a terminal disclaimer.

(21) Appl. No.: 12/341,045

(22) Filed: Dec. 22, 2008

(65) Prior Publication Data

US 2009/0170686 A1    Jul. 2, 2009

Related U.S. Application Data

(60) Provisional application No. 61/019,872, filed on Jan. 9, 2008.

(30) Foreign Application Priority Data

Dec. 27, 2007  (JP) .................................. 2007-337721
Mar. 21, 2008  (JP) .................................. 2008-074427
Jun. 10, 2008  (JP) .................................. 2008-152099
Nov. 27, 2008  (JP) .................................. 2008-303233

(51) Int. Cl.
*H01L 41/18* (2006.01)
*H01L 41/22* (2006.01)

(52) U.S. Cl. ............ 252/62.9 R; 252/62.9 PZ; 501/134; 501/135; 501/136

(58) Field of Classification Search ............. 252/62.9 R, 252/62.9 PZ; 501/134, 135, 136
See application file for complete search history.

(56) References Cited

U.S. PATENT DOCUMENTS

| 6,620,752 B2 * | 9/2003 | Messing et al. ............... 501/136 |
| 7,700,067 B2 * | 4/2010 | Yokoyama et al. ........ 423/593.1 |
| 2002/0193237 A1 | 12/2002 | Messing et al. |

FOREIGN PATENT DOCUMENTS

JP    2006-185940    7/2006

* cited by examiner

*Primary Examiner* — Carol M Koslow
(74) *Attorney, Agent, or Firm* — Burr & Brown

(57) ABSTRACT

A crystallographically-oriented ceramic containing Pb and in which piezoelectric/electrostrictive properties can be enhanced. Using a raw material having $Pb(Zr_{1-x}Ti_x)O_3$ as a main component, a ceramic sheet was formed with a thickness of 15 μm or less. In this material, grains were allowed to grow into an anisotropic shape, and crystal grains with specific crystal planes being aligned were produced. A non-oriented raw material having $Pb(Zr_{1-x}Ti_x)O_3$ as a main component and the crystal grains were mixed, and shaping was performed so that crystal grains were oriented in a predetermined direction. The shaped body was fired. In the resulting ceramic, the degree of orientation was high at 50% or more. It is possible to enhance the degree of orientation using, as crystal nuclei, a ceramic sheet which can have the same composition as that of the crystallographically-oriented ceramic. Therefore, production can be performed without adding an unnecessary element, for example, for orienting crystals.

3 Claims, 4 Drawing Sheets

CRYSTALLOGRAPHICALLY-ORIENTED CERAMIC

BACKGROUND OF THE INVENTION

1. Field of the Invention

The present invention relates to a crystallographically-oriented ceramic. Specifically, the invention relates to a crystallographically-oriented ceramic used for a piezoelectric/electrostrictive material.

2. Description of the Related Art

To date, as ceramics used for piezoelectric/electrostrictive materials, for example, ceramics which contain $Pb(Zr, Ti)O_3$ as a main component, in which the number ratio of crystalline bodies whose grain diameters in a width direction are larger than those in a thickness direction is 70% or more in a large number of crystalline bodies observed in an arbitrary section in the thickness direction, and which have excellent piezoelectric properties and electrostrictive properties have been proposed (for example, refer to Japanese Unexamined Patent Application Publication No. 2006-185940). Furthermore, lead-based piezoelectric materials in which a crystal of $(1-x)Pb(Mg_{1/3}Nb_{1/3})O_3-xPbTiO_3$ is oriented by adding 5 vol % or more of $SrTiO_3$, $BaTiO_3$, or the like so that strain properties are enhanced have been proposed (for example, refer to US Application Publication No. 2002/0193237).

SUMMARY OF THE INVENTION

As described above, in crystallographically-oriented ceramics described in Japanese Unexamined Patent Application Publication No. 2006-185940, by controlling the aspect ratios of grains to a predetermined range, piezoelectric properties and electrostrictive properties can be enhanced. However, this is still not sufficient. Further improvements in piezoelectric properties and electrostrictive properties are desired. Furthermore, because of the manufacturing process, the piezoelectric/electrostrictive material according to US Application Publication No. 2002/0193237 contains 5 vol % or more of a heterogeneous material having low piezoelectric properties, such as $SrTiO_3$ or $BaTiO_3$, and thus improvements in piezoelectric/electrostrictive properties are insufficient. Moreover, in such a structure, for example, when driving is repeated in a high electric field exceeding 1 kV/mm, cracks, presumably due to stress generated at the interface with the heterogeneous material, may occur, thereby causing a problem in durability.

The present invention has been achieved in consideration of the problems described above. An object of the invention is to provide a crystallographically-oriented ceramic which contains Pb and in which piezoelectric/electrostrictive properties can be further enhanced while deterioration of durability is reduced.

As a result of diligent studies conducted by the present inventors to achieve the object described above, it has been found that, in crystallographically-oriented ceramics containing Pb, if the ceramic does not include crystalline bodies of $SrTiO_3$ or $BaTiO_3$ and a plurality of crystalline bodies contained therein are oriented with specific crystal planes being aligned, piezoelectric/electrostrictive properties can be further enhanced while deterioration of durability is reduced.

That is, a crystallographically-oriented ceramic according to the present invention includes a plurality of crystalline bodies containing an oxide represented by general formula $ABO_3$ as a main component, wherein the A site contains Pb, and the B site contains at least two elements selected from the group consisting of Zr, Ti, Nb, Mg, Ni, and Zn; and does not include crystalline bodies of $SrTiO_3$ or $BaTiO_3$. The plurality of crystalline bodies are oriented with specific crystal planes being aligned. The degree of orientation of the crystalline bodies measured by the Lotgering method is 50% or more.

In the crystallographically-oriented ceramic, piezoelectric/electrostrictive properties can be further enhanced while deterioration of durability is reduced. The reason for being able to obtain such an advantage is not clear. However, for example, in the case where crystalline bodies are not oriented, depending on the crystal direction, crystalline bodies that cannot exhibit the piezoelectric effect or electrostrictive effect are present, resulting in low efficiency. In contrast, in the present invention, it is assumed that since the plurality of crystalline bodies are oriented with a high degree of orientation of 50% or more, when measured by the Lotgering method, and with specific crystal planes being aligned, the crystalline bodies efficiently fulfill their respective functions. Furthermore, a heterogeneous material having low piezoelectric properties, such as $SrTiO_3$ or $BaTiO_3$, is not present in the form of crystalline bodies. Therefore, it is assumed that, for example, when driving is repeated in a high electric field exceeding 1 kV/mm, it is possible to prevent the occurrence of cracks presumably due to stress generated at the interface with the heterogeneous material, and thus a decrease in durability can be suppressed compared with the case where such a heterogeneous material is present.

BRIEF DESCRIPTION OF THE DRAWINGS

FIGS. 1A to 1C are views illustrating an example of a method for producing a crystallographically-oriented ceramic, in which FIG. 1A shows a ceramic sheet 20, FIG. 1B shows a secondary shaped body 40, and FIG. 1C shows a crystallographically-oriented ceramic 50;

FIGS. 2A to 2D are views illustrating an example of a method for producing a crystallographically-oriented ceramic, in which FIG. 2A shows a step of stacking a ceramic sheet 20 and a raw material powder sheet 32, FIG. 2B shows a step of repeatedly stacking ceramic sheets 20 and raw material powder sheets 32, FIG. 2C shows a secondary shaped body 42 which is a laminate, and FIG. 2D shows a crystallographically-oriented ceramic 50;

DETAILED DESCRIPTION OF THE INVENTION

Figure 1A:
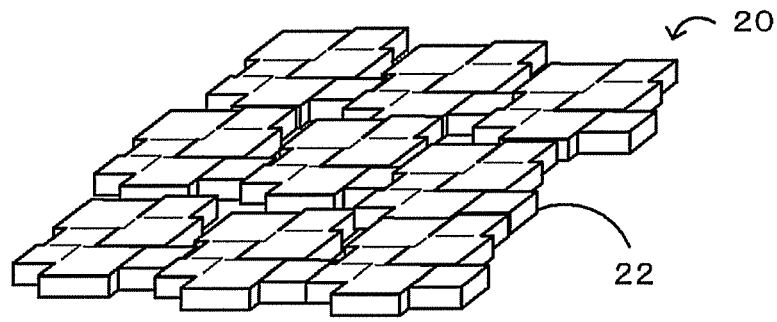
Figure 1A:

A crystallographically-oriented ceramic according to the present invention includes a plurality of crystalline bodies containing an oxide represented by general formula $ABO_3$ as a main component, wherein the A site contains Pb, and the B site contains at least two elements selected from the group consisting of Zr, Ti, Nb, Mg, Ni, and Zn; and does not include crystalline bodies of $SrTiO_3$ or $BaTiO_3$. The plurality of crystalline bodies are oriented with specific crystal planes being aligned. The degree of orientation of the crystalline bodies measured by the Lotgering method is 50% or more.

In the crystallographically-oriented ceramic according to the present invention, the degree of orientation of the specific planes measured by the Lotgering method is 50% or more, preferably 60% or more, and more preferably 80% or more. If the degree of orientation is 50% or more, higher piezoelectric/electrostrictive properties can be obtained. The specific crystal plane may be the pseudocubic (100) plane in the crystallographically-oriented ceramic. The term "pseudocubic (100)" means that although an isotropic perovskite-type oxide has a structure, such as a tetragonal, rhombic, or trigonal structure, which is slightly distorted from the cubic structure, since the amount of distortion is very small, the pseudocubic structure is considered to be a cubic structure and designated by the Miller indices. Here, in the measurement of the degree of orientation by the Lotgering method, XRD diffraction patterns of a specific crystallographically-oriented plane are measured and the degree of orientation is obtained using equation (1) below. In equation (1), $\Sigma I(HKL)$ is the sum of X-ray diffraction intensities of all crystal planes (hkl) measured in the crystallographically-oriented ceramic; $\Sigma I0(hkl)$ is the sum of X-ray diffraction intensities of all crystal planes (hkl) measured in a non-oriented plane having the same composition as the crystallographically-oriented ceramic; $\Sigma' I(HKL)$ is the sum of X-ray diffraction intensities of crystallographically equivalent specific crystal planes (e.g., (100) plane) measured in the ceramic sheet; and $\Sigma' I0(HKL)$ is the sum of X-ray diffraction intensities of specific crystal planes measured in a non-oriented plane having the same composition as the crystallographically-oriented ceramic. The degree of orientation of the specific planes measured by the Lotgering method is 50% or more, but may be 25% or more, or may be 30% or more.

$$\text{Degree of orientation} = \frac{\frac{\Sigma' I(HKL)}{\Sigma I(hkl)} - \frac{\Sigma' I_0(HKL)}{\Sigma I_0(hkl)}}{1 - \frac{\Sigma' I_0(HKL)}{\Sigma I_0(hkl)}} \times 100\% \quad \text{Equation (1)}$$

The crystallographically-oriented ceramic according to the present invention includes a plurality of crystalline bodies containing an oxide represented by general formula $ABO_3$ as a main component, wherein the A site contains Pb, and the B site contains at least two elements selected from the group consisting of Zr, Ti, Nb, Mg, Ni, and Zn. Preferably, in the plurality of crystalline bodies, in general formula $ABO_3$, the A site is Pb, and the B site contains Zr and Ti. In such a case, the B site may further contain at least one element selected from the group consisting of Nb, Mg and Ni. For example, the crystallographically-oriented ceramic may contain at least one of $Pb(Mg_xNb_{1-x})O_3$ ($0 \leq x \leq 1$), $PbZrO_3$, $PbTiO_3$, $Pb(Ni_xNb_{1-x})O_3$, and $Pb(Zn_xNb_{1-x})O_3$. The oxide containing Pb preferably has a perovskite structure. The crystallographically-oriented ceramic includes preferably 85% by volume or more, more preferably 90% by volume or more, and most preferably 96% by volume or more of crystalline bodies containing 50% by weight or more of Pb. Thereby, it is possible to prevent piezoelectric/electrostrictive properties from degrading under the influence of impurities. The elements contained in the crystalline bodies are detected by a method in which a cross section of the crystallographically-oriented ceramic is observed with a scanning electron microscope (SEM) and electron probe microanalysis (EPMA) is carried out. The "percent by volume of crystalline bodies containing 50% by weight or more of Pb" is determined by mapping a region which contains 50% by weight or more of Pb by EPMA in the range observed with the SEM, and determined as the area of a region containing 50% by weight or more of Pb occupying the crystal grain region excluding vacancies in the mapped region.

The crystallographically-oriented ceramic according to the present invention does not include crystalline bodies of $SrTiO_3$ or $BaTiO_3$. In some cases, Pb-containing crystallographically-oriented ceramics may include crystalline bodies of $SrTiO_3$ or $BaTiO_3$ so that the degree of orientation of Pb-containing crystalline bodies can be increased. Since the crystallographically-oriented ceramic according to the present invention does not include crystalline bodies of $SrTiO_3$ or $BaTiO_3$, it is possible to prevent the occurrence of cracks presumably due to stress generated at the interface with the heterogeneous material, such as $SrTiO_3$ or $BaTiO_3$, and thus a decrease in durability can be suppressed compared with the case where such a heterogeneous material is present. A crystallographically-oriented ceramic including a plurality of crystalline bodies containing an oxide represented by general formula $ABO_3$ as a main component, wherein the A site contains Pb, and Pb in the A site is partially replaced by Sr or Ba may be considered as the crystallographically-oriented ceramic according to the present invention, as long as the crystallographically-oriented ceramic does not include crystalline bodies of $SrTiO_3$ or $BaTiO_3$.

Figure 1B:
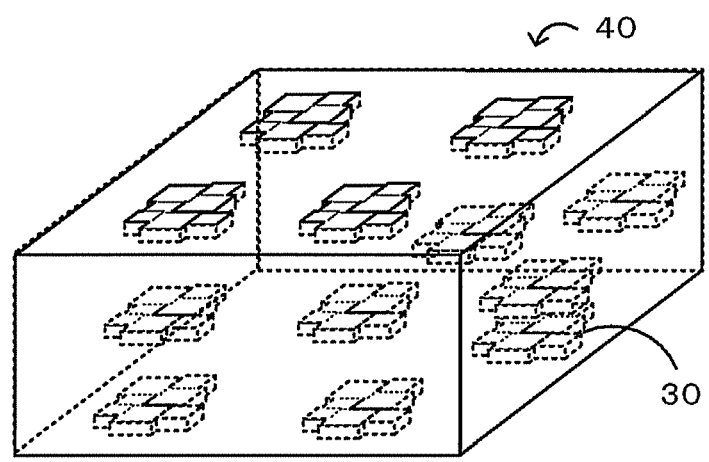
Figure 1B:
Figure 1C:
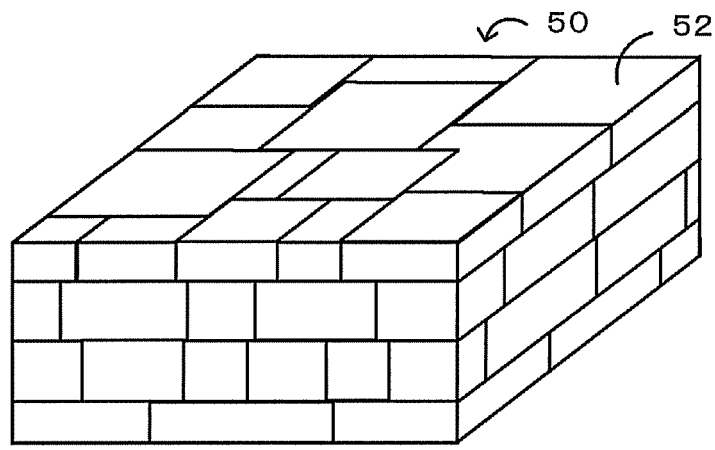
Figure 2A:
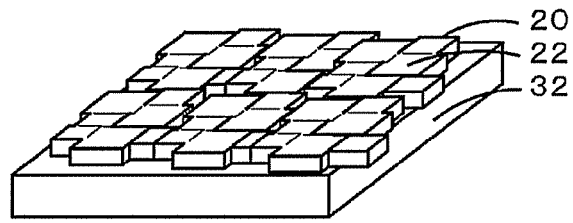
Figure 2A:
Figure 2B:
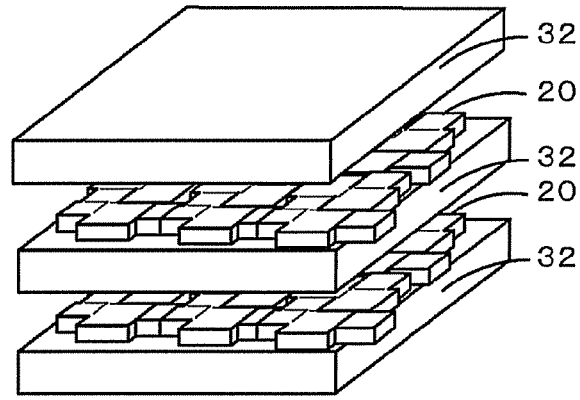
Figure 2B:
Figure 2C:
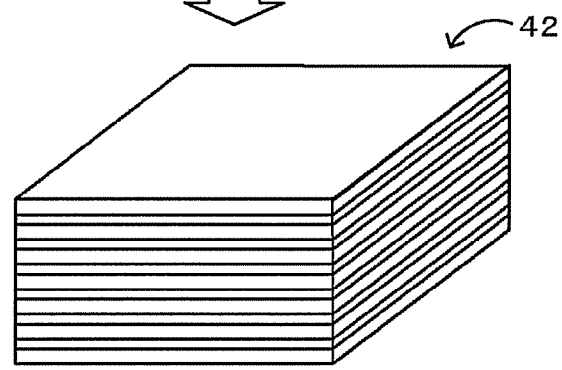
Figure 2C:
Figure 2D:
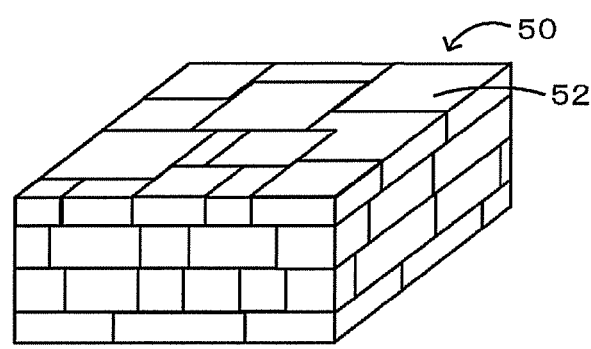

A method for producing a crystallographically-oriented ceramic will be described below. FIGS. 1A to 1C are views illustrating an example of a method for producing a crystallographically-oriented ceramic, in which FIG. 1A shows a ceramic sheet 20, FIG. 1B shows a secondary shaped body 40, and FIG. 1C shows a crystallographically-oriented ceramic 50. The method for producing the crystallographically-oriented ceramic includes step (1) of forming a ceramic sheet which serves as a template (crystal nuclei) for a crystallographically-oriented ceramic (FIG. 1A), step (2) of shaping in which crystal grains of the ceramic sheet and inorganic particles as raw materials are mixed and subjected to orientation-shaping (FIG. 1B), and step (3) of firing a shaped body (FIG. 1C). The individual steps will be described below in that order.

(1) Formation Step of Forming Ceramic Sheet

This step further includes a preparation step of preparing inorganic particles, a sheet shaping step, and a first firing step. In the ceramic sheet, by shaping inorganic particles into a very thin sheet with a thickness of 15 μm or less, followed by firing, crystal grains are grown along the sheet surface. In such a manner, since a sheet-like shaped body with a thickness of 15 μm or less is fired to cause grain growth, grain growth in the thickness direction of the sheet is limited, and grain growth is more promoted in the surface direction of the sheet. Therefore, for example, under predetermined firing conditions, it is possible to allow even crystal grains that grow into crystal grains with an isotropic and polyhedral shape, for example, a cube, to grow into planar crystal grains having a larger aspect ratio with specific crystal planes being aligned with the surface of the sheet (being oriented). By orienting other non-oriented raw materials using as nuclei the crystal grains having a large aspect ratio, it is possible to obtain a crystallographically-oriented ceramic in which specific crystal planes are better oriented. Here, in the oxide represented by general formula $ABO_3$, wherein the A site contains Pb, and the B site contains at least two elements selected from the group consisting of Zr, Ti, Nb, Mg, Ni, and Zn, and having the perovskite structure, for example, by adjusting the compositional ratio, or by adding an additive (glass or the like) that activates surface diffusion of crystal grains to the oxide, in some cases, grains grow into a pseudocubic structure in the shape of a dice (hexahedral shape) among polyhedral shapes. When a very thin sheet shape is formed, in some cases, the (100) plane grows along the surface of the sheet and the (100) crystal plane is easily oriented in a direction perpendicular to the surface of the sheet. In such a case, in grains having two faces parallel to the surface of the sheet, four faces other than the two faces are included as the growing planes in all directions in a shaped body. Thus, grain growth occurs isotropically in the sheet, and the two faces present in the surfaces of the sheet expand naturally. Consequently, it is possible to easily obtain grains having a large aspect ratio. Therefore, in the method using the ceramic sheet, if the crystal planes of the oxide having the perovskite structure containing Pb, Zr, and Ti are oriented, formation can be performed without adding an unnecessary element, for example, for orienting crystals, the degree of orientation of the crystallographically-oriented ceramic can be increased, and a decrease in the purity thereof can be prevented. Note that the phrase "without adding an unnecessary element" does not exclude a case where an additive for enhancing the degree of orientation or mechanical strength is added within a range that does not significantly affect piezoelectric/electrostrictive properties. Furthermore, the additive is not necessarily required and may or may not be added. The expression "growth form under predetermined firing conditions" is defined as the morphology observed when crystals of inorganic particles come to equilibrium with each other under given heat-treating conditions, which is, for example, obtained by observing the shape of grains at a bulk surface when it is crystallized by firing. Furthermore, the term "anisotropic shape" refers to a shape in which the ratio of major axis length to minor axis length (aspect ratio) is large (e.g., with an aspect ratio of 2 or more), such as a tabular, strip-like, columnar, needle-like, or flake-like shape. Furthermore, the "isotropic and polyhedral" shape means, for example, a cubic shape. The aspect ratio of the crystal grains included in the ceramic sheet is determined by the method described below. First, SEM photographs were taken using a scanning electron microscope (JSM-6390 manufactured by JEOL Ltd.). The thickness of each ceramic sheet was determined from the SEM photographs. The sheet surface of the ceramic sheet was observed, and in a field of view which included about 20 to 40 crystal grains, an area S per grain was calculated using the formula {(area of the field of view)/(number of grains)}. Assuming that each grain had a circular shape, a grain diameter was calculated using the equation (2) described below. The value obtained by dividing the grain diameter by the thickness of the sheet was defined as the aspect ratio.

$$\text{Grain Diameter} = 2\sqrt{S/\pi} \quad \text{Equation (2)}$$

First, in the preparation step of preparing inorganic particles, preferably, raw materials for the inorganic particles are pulverized and mixed, the mixed powder is calcined, and the resulting inorganic particles are further pulverized. The inorganic particles form an oxide having the perovskite structure, and in the crystals after firing, in the oxide represented by general formula $ABO_3$, the A site contains Pb, and the B site contains Zr and Ti. Furthermore, the A site may contain another element, and the B site may contain at least one element selected from the group consisting of Nb, Mg, Ni, and Zn. When the above elements are added to the B site, crystallinity can be enhanced or piezoelectric/electrostrictive properties can be enhanced. When inorganic particles which form an oxide represented by general formula $ABO_3$ are used, preferably, raw materials are prepared such that the ratio of the A site to the B site, A/B, will be 1.0 or higher. When the A/B is in the range of 1.0 or higher, it is possible to increase the aspect ratio and the degree of orientation of crystals contained in the fired ceramic sheet. Furthermore, the A/B in the range of 1.0 or higher is preferable in view of compensation of Pb or the like that volatilizes during firing. As the raw materials for the inorganic particles, oxides, hydroxides, carbonates, sulfates, nitrates, or the like of the desired components may be used. Preferably, oxides and carbonates are mainly used. In the pulverization of the inorganic particles, the particle diameter is preferably set according to the thickness of the sheet. The median diameter (D50) of the inorganic particles is preferably 2% or more and 60% or less of the thickness of the sheet. If the median diameter is 2% or more of the thickness of the sheet, pulverization can be easily performed. If the median diameter is 60% or less of the thickness of the sheet, the thickness of the sheet can be easily adjusted. The particle diameter is determined using a method in which inorganic particles are dispersed in a dispersion medium (organic solvent, water, or the like), and the particle diameter is measured using a laser diffraction/scattering particle size distribution analyzer. The pulverization of the inorganic particles is preferably conducted by wet pulverization. For example, a ball mill, a bead mill, a trommel, an attritor, or the like may be used.

In the ceramic sheet shaping step, the inorganic particles are formed into a self-supported planar shaped body with a sheet thickness of 15 µm or less. The sheet shaping can be conducted, for example, by a doctor-blade method using a slurry containing the inorganic particles, or extrusion molding using a puddle containing the inorganic particles. When the doctor-blade method is used, for example, a slurry is applied to a flexible plate (e.g., organic polymer plate, such as PET film), the applied slurry is solidified by drying to form a shaped body, and the shaped body is separated from the plate. Thereby, a shaped body of the ceramic sheet before firing may be obtained. When a slurry or a puddle is prepared before shaping, the inorganic particles may be dispersed in an appropriate dispersion medium, and a binder, a plasticizer, or the like may be appropriately added thereto. The slurry is preferably adjusted so as to have a viscosity of 500 to 700 cP and is preferably defoamed under reduced pressure. The thickness of the sheet is 15 µm or less, preferably 10 µm or less, more preferably 5 µm or less, and still more preferably 2 µm. At 10 µm or less, a high degree of orientation can be obtained, and at 5 µm or less, a higher degree of orientation can be obtained. The thickness of the sheet is preferably 0.1 µm or more. If the thickness of the sheet is 0.1 µm or more, a self-supported planar sheet can be easily formed. Examples of other methods that may be used include high-speed spraying of particles, such as aerosol deposition; and a method in which a film is formed on a substrate made of a resin, glass, ceramic, metal, or the like by a vapor-phase method, such as sputtering, CVD, or PVD, and then the film is separated from the substrate to obtain a shaped body of the ceramic sheet before firing. In this case, since the density of the shaped body before firing can be increased, grain growth proceeds at low temperature, volatilization of constituent elements can be prevented, and the resulting crystallographically-oriented ceramic has high density, all of which are advantageous. In this ceramic sheet shaping step, the shaped body of the ceramic sheet before firing was prepared so as not to include crystalline bodies of $SrTiO_3$ or $BaTiO_3$ in raw material.

In the step of firing the ceramic sheet, the shaped body obtained in the shaping step is fired with or without an inactive layer which does not substantially react with the shaped body (e.g., fired ceramic plate, Pt plate, carbon plate, graphite plate, molybdenum plate, or tungsten plate) being disposed adjacent to the shaped body. For example, green shaped sheets and inactive layers may be alternately stacked, followed by firing, the inactive layers being inactive at the firing temperature of the shaped body. Alternatively, a method may be used in which a shaped sheet is stacked on an inactive sheet, the resulting laminate is formed into a roll, and then firing is performed. Alternatively, a method may be used in which a shaped body in the form of a sheet is formed on an inactive layer, and after firing, the sheet is separated from the inactive layer. Alternatively, a method may be used in which a sheet-like shaped body is formed on an inactive layer, and after firing, the inactive layer is removed. Preferably, the shaped body is fired in a state in which volatilization of a specific component (e.g., Pb) contained in the shaped body is suppressed. By suppressing a specific element from being volatilized from the shaped body, the composition after firing can be prevented from varying. For example, in order to achieve the volatilization-suppressing state, the shaped body may be fired in a state in which other inorganic particles coexist with the inorganic particles constituting the shaped body, or the shaped body may be placed in a covered sheath or the like and fired in a sealed state. In such a case, it is important to empirically set conditions during firing, such as the amount of the inorganic particles allowed to coexist and the inner volume of the sheath, to be appropriate. Furthermore, from the standpoint of accelerating in-plane grain growth, firing under pressure, such as hot pressing, may be performed. With respect to the firing conditions, preferably, the shaped sheet is fired at a temperature that is higher, by 10 percent or more, than the firing temperature at which equilibrium-shaped crystals are obtained by firing, for example, at the firing temperature at which densification and grain growth are caused by firing a bulk. At the temperature higher by 10 percent or more, grain growth of crystals contained in the ceramic sheet with a thickness of 15 μm or less can be promoted sufficiently. Preferably, firing is performed at a high temperature to such an extent that the material of the shaped body is not decomposed. In particular, when the thickness of the sheet is decreased, grain growth does not easily proceed, and therefore, it is preferable to increase the firing temperature. For example, in the step of firing inorganic particles containing $Pb(Zr_{1-x}Ti_x)O_3$ as a main component to which glass is added, the firing temperature for the shaped body is preferably set at 900° C. to 1,300° C. At a firing temperature of 900° C. or higher, crystal growth of the particles is promoted, which is preferable. At a temperature of 1,300° C. or less, volatilization of contained components, etc. can be reduced, and decomposition of the material can be suppressed. Thereby, as shown in FIG. 1A, a ceramic sheet 20 can be obtained. In the ceramic sheet 20, the contained inorganic particles have grown into crystal grains 22 in which the length in the surface direction of the sheet is larger than the length in the thickness direction, and specific crystal planes are aligned. Furthermore, by addition of glass, since crystal grains easily grow into a pseudocubic structure in the shape of a dice (hexahedral shape) among polyhedral shapes, it is possible to easily obtain crystal grains 22 in which specific crystal planes are aligned. Besides glass, MgO can be used as an additive. It is assumed that MgO added in excess not only increases the degree of orientation but also is precipitated as a heterogeneous phase without being incorporated into the crystal lattices. MgO is more preferred than glass from the standpoint that piezoelectric properties are not degraded.

(2) Shaping Step of Shaping Crystallographically-oriented Ceramic

The resulting ceramic sheet is formed into crystal grain powder by crushing such that the aspect ratio is not less than or equal to 2, and preferably not less than or equal to 3. Subsequently, a mixing step is carried out, in which the crystal grain powder, other raw material powder (e.g., non-oriented inorganic particles), and as necessary, a binder, a plasticizer, or the like are mixed. Then, orientation-shaping (secondary orientation) is performed so that the crystal grains are oriented in a predetermined direction. Thereby, it is possible to form an arbitrary shape, for example, with a thickness exceeding 15 μm. At this time, the compositional ratio of the crystal grain powder obtained from the ceramic sheet may be different from or the same as the compositional ratio of the other raw material powder. Furthermore, in the powder containing the crystal grains, the crystal grains may be separated from each other or a certain number of crystal grains may be bonded together to form polycrystalline particles. The orientation-shaping can be performed by the doctor-blade method, extrusion molding, or the like described above. By performing such shaping, a shaped body in which raw material powder is present around crystal grains oriented in a predetermined direction can be obtained. The resulting shaped body may be directly subjected to the subsequent firing step. Alternatively, two or more shaped bodies may be stacked and then subjected to the subsequent firing step. In such a manner, as shown in FIG. 1B, for example, a secondary shaped body 40 is produced, in which polycrystalline particles 30, each including a plurality of crystal grains 22 bonded together, are arranged in the surface direction.

(3) Firing Step of Crystallographically-oriented Ceramic

Then, a second firing step is carried out in which the secondary shaped body is fired such that the other raw material powder is oriented in the direction in which the crystal grains are oriented. Thereby, a crystallographically-oriented ceramic is obtained. The firing temperature in the second firing step may be equal to or higher than the firing temperature at which equilibrium-shaped crystals are obtained under predetermined firing conditions described above. Furthermore, in the case of a shaped body containing a binder or the like, heat treatment, mainly for the purpose of degreasing, may be performed before firing is performed. In such a case, the degreasing temperature is set at a temperature sufficient to thermally decompose organic substances, such as a binder (e.g., 400° C. to 600° C.). After degreasing, Preferably, cold isostatic pressing (CIP) is performed before firing is performed. If cold isostatic pressing is further performed on the degreased shaped body, it is possible to suppress a decrease in the degree of orientation resulting from degreasing. In this firing step, as in the firing of the ceramic sheet described above, firing may be performed in a volatilization-suppressing state. Thereby, as shown in FIG. 1C, it is possible to obtain a crystallographically-oriented ceramic 50 having many oriented crystals (crystalline bodies) 52 in which specific crystal planes are aligned. In such a manner, the degree of orientation of the crystallographically-oriented ceramic can be set, for example, at 50% or more.

The resulting crystallographically-oriented ceramic can be used as a piezoelectric member or an electrostrictive member. When the crystallographically-oriented ceramic is used as a piezoelectric member or an electrostrictive member, crystallographically-oriented ceramics and electrodes may be alternately stacked on a substrate. Although the method of producing the crystallographically-oriented ceramic which does not include electrodes has been described above, it may be also possible to produce a crystallographically-oriented ceramic in which electrodes are formed by a method in which electrodes are disposed at given positions of a secondary shaped body, and then the firing step described above is carried out. In such a manner, orientation of grains and formation of electrodes can be performed by one firing step, thus increasing production efficiency. Furthermore, the crystallographically-oriented ceramic may be used in applications other than those described above. For example, the crystallographically-oriented ceramic can be used for polycrystalline materials composed of a substance, the function or properties of which have crystal orientation dependence, such as dielectric materials, pyroelectric materials, and ferroelectric materials. Specifically, high-performance elements can be obtained by applying the crystallographically-oriented ceramic in various sensors, such as acceleration sensors, pyroelectric sensors, ultrasonic sensors, electric field sensors, temperature sensors, gas sensors, knocking sensors, yaw rate sensors, air bag sensors, and piezoelectric gyro sensors; energy transducers, such as piezoelectric transformers; low-loss actuators or low-loss resonators, such as piezoelectric actuators, ultrasonic motors, and resonators; and other elements, such as capacitors, bimorph piezoelectric elements, vibration pickups, piezoelectric microphones, piezoelectric ignition elements, sonars, piezoelectric buzzers, piezoelectric speakers, oscillators, filters, dielectric elements, microwave dielectric elements, thermoelectric conversion elements, and pyroelectric elements. In such cases, the degree of orientation of the crystallographically-oriented ceramic is appropriately set depending on the application.

In the crystallographically-oriented ceramic according to the embodiment described above, the degree of orientation measured by the Lotgering method is high at 50% or more, and it is possible to further enhance piezoelectric/electrostrictive properties. Furthermore, it is possible to enhance the degree of orientation using, as crystal nuclei, a ceramic sheet which can be made from raw materials having the same composition as that of the crystallographically-oriented ceramic. Therefore, production can be performed without adding an unnecessary element, for example, for orienting crystals, the degree of orientation of the crystallographically-oriented ceramic can be increased, and a decrease in the purity thereof can be prevented. Consequently, piezoelectric/electrostrictive properties can be further enhanced. Furthermore, by using the ceramic sheet, even in a material which grows into crystal grains with an isotropic and polyhedral shape, for example, a cube, and which contains $Pb(Zr_{1-x}Ti_x)O_3$ as a main component, grains are allowed to grow into an anisotropic shape, and the material can be effectively used for enhancing crystal orientation.

It is to be understood that the present invention is not limited to the embodiment described above, and various embodiments within the scope of the technical field of the present invention can be carried out.

In the embodiment described above, the ceramic sheet is crushed, and the crushed crystal grains are used to produce a crystallographically-oriented ceramic. Alternatively, a crystallographically-oriented ceramic may be produced using the ceramic sheet without crushing. For example, a crystallographically-oriented ceramic may be produced by a method including a stacking step of stacking the ceramic sheet and a raw material powder sheet containing raw material powder to form a secondary shaped body, and a second firing step of the secondary shaped body such that the raw material powder is oriented in the direction in which the crystal grains contained in the ceramic sheet are oriented. FIGS. 2A to 2D are views illustrating a process for producing a crystallographically-oriented ceramic by stacking ceramic sheets. Specifically, the other raw material powder (e.g., non-oriented inorganic particles or the like) and as necessary, a binder, a plasticizer, or the like are mixed to prepare a raw material paste containing the raw material powder, and the raw material paste is formed into a raw material powder sheet 32 with a predetermined thickness, for example, 1 to 20 μm, by screen printing, a doctor-blade method, or the like. A ceramic sheet 20 containing crystal grains 22 grown in the surface direction is stacked on the raw material powder sheet 32 (refer to FIG. 2A), and the resulting laminate is dried appropriately at a drying temperature of 80° C. to 150° C. By repeating the stacking step in which ceramic sheets 20 and raw material powder sheets 32 are alternately stacked until the required thickness of the crystallographically-oriented ceramic is achieved (refer to FIG. 2B), a secondary shaped body 42 (laminate) is obtained (refer to FIG. 2C). Subsequently, the secondary shaped body 42 is fired at a predetermined firing temperature so as to cause grain growth of the raw material contained in the raw material powder sheet 32 in the direction in which the crystal grains 22 are oriented to obtain a crystallographically-oriented ceramic 50 including many oriented crystals 52 (refer to FIG. 2D). Before the firing, degreasing may be performed by calcination at a predetermined calcining temperature (e.g., 600° C.). In the second firing step, preferably, the secondary shaped body 42 is fired by firing under pressure, such as hot pressing, in order to further accelerate grain growth and densification. In such a manner, as in the method described above, it is possible to orient the other raw material powder in the direction in which the crystal grains are oriented using the ceramic sheets, and thus a crystallographically-oriented ceramic with a high degree of orientation can be easily produced.

EXAMPLES

Examples in which crystallographically-oriented ceramics are specifically produced will be described below.

Example 1

Formation Step of Forming Ceramic Sheet $ZnO$—$B_2O_3$—$SiO_2$ glass powder (ASF1891 manufactured by Asahi Glass (AGG)) (0.5% by weight) was mixed with a synthesized powder having the composition, after grain growth, $0.2Pb(Mg_{0.33}Nb_{0.67})O_3$-$0.35PbTiO_3$-$0.45PbZrO_3$ to which 1% by weight of NiO was added. The weighed mixture, zirconia balls, and ion-exchanged water as a dispersion medium were placed in a plastic pot, and wet mixing was performed using a ball mill for 16 hours. The resulting slurry was dried using a dryer, and then calcination was performed at 800° C. for 2 hours. The calcined powder, zirconia balls, and ion-exchanged water as a dispersion medium were subjected to wet pulverization using a ball mill for 5 hours, followed by drying using a dryer. Thereby, powder of first inorganic particles was obtained. The resulting first inorganic particles, polyvinyl butyral (BM-2, manufactured by Sekisui Chemical Co., Ltd.) as a binder, a plasticizer (DOP, manufactured by Kurogane Kasei Co., Ltd.), and a dispersant (SP-O30, manufactured by Kao Corporation) were mixed into a dispersion medium obtained by mixing equal amounts of toluene and isopropanol to prepare a shaping material in the form of a slurry. The amounts of the individual materials used were 100 parts by weight of the dispersion medium, 10 parts by weight of the binder, 4 parts by weight of the plasticizer, and 2 parts by weight of the dispersant on the basis of 100 parts by weight of inorganic particles. The resulting slurry was formed into a sheet on a PET film by a doctor-blade method so that the thickness after drying was 1 μm. The resulting shaped body, with the same shaping material being allowed to coexist, was subjected to degreasing at 600° C. for 2 hours, and then firing was performed at 1,100° C. for 5 hours. After firing, a portion not adhering to the setter was retrieved, and thereby, a ceramic sheet used for a crystallographically-oriented ceramic was obtained. Furthermore, a synthesized powder having the composition, after grain growth, $0.2Pb(Mg_{0.33}Nb_{0.67})O_3$-$0.35PbTiO_3$-$0.45PbZrO_3$ to which 1% by weight of NiO was weighed and placed in a plastic pot together with zirconia balls, and ion-exchanged water as a dispersion medium. Wet mixing was performed using a ball mill for 16 hours. The resulting slurry was dried using a dryer, and then calcination was performed at 800° C. for 2 hours. Thereby, second inorganic particles were obtained.

Shaping Step of Shaping Crystallographically-Oriented Ceramic

The resulting ceramic sheet was crushed such that the aspect ratio was not less than or equal to 3, thereby forming powder of plate-like polycrystalline particles, each of which includes a plurality of crystal grains bonded together, having the composition $0.2Pb(Mg_{0.33}Nb_{0.67})O_3$-$0.35PbTiO_3$-$0.45PbZrO_3$ to which 1% by weight of NiO and 0.5% by weight of $ZnO$—$B_2O_3$—$SiO_2$ glass powder were added. Then, into a dispersion medium obtained by mixing equal amounts of toluene and isopropanol, the crystal grains of the first inorganic particles, the second inorganic particles (non-oriented raw material powder), polyvinyl butyral (BM-2, manufactured by Sekisui Chemical Co., Ltd.) as a binder, a plasticizer (DOP, manufactured by Kurogane Kasei Co., Ltd.), and a dispersant (SP-O30, manufactured by Kao Corporation) were mixed to prepare a shaping material in the form of a slurry such that the composition was $0.2Pb(MgO_{0.33}Nb_{0.67})O_3$-$0.35PbTiO_3$-$0.45PbZrO_3$ to which 1% by weight of NiO and 0.1% by weight of $ZnO$—$B_2O_3$—$SiO_2$ glass were added. The amounts of the individual materials used were 25 parts by crystal grains, 100 parts by weight of the dispersion medium, 10 parts by weight of the binder, 4 parts by weight of the plasticizer, and 2 parts by weight of the dispersant on the basis of 100 parts by weight of the second inorganic particles. The resulting slurry was defoamed by stirring under reduced pressure so that the viscosity was adjusted to 1000 to 2000 cP. The viscosity of the slurry was measured using an LVT viscometer manufactured by Brookfield. The resulting slurry was formed into a sheet by a doctor-blade method such that crystal grains were oriented in one direction and the thickness after drying was 100 μm, followed by drying at room temperature. Furthermore, 200 plates thus obtained were stacked and pressure-bonded at 20 kg/cm$^2$ and 80° C. Thereby, a crystallographically-oriented ceramic shaped body was obtained.

Firing step of crystallographically-oriented ceramic The resulting crystallographically-oriented ceramic shaped body, with the same shaping material being allowed to coexist, was subjected to degreasing at 600° C. for 2 hours, and then firing was performed at 1,100° C. for 5 hours to cause the grain growth of the inorganic particles contained therein along the crystal grains. Thereby, a crystallographically-oriented ceramic of Example 1 was obtained.

Example 2

In the formation step of forming a ceramic sheet, 0.5% by weight of MgO was added to a synthesized powder having the composition, after grain growth, $0.2Pb(Mg_{0.33}Nb_{0.67})O_3$-$0.35PbTiO_3$-$0.45PbZrO_3$ to which 0.5% by weight of NiO was added. Then, as in Example 1, the slurry was formed into a sheet on a PET film such that the thickness after drying was 1 μm. The shaped body peeled off from the PET film was cut into a 50-mm square with a cutter and placed in the center of a setter made of zirconia (size 60 mm square, height 5 mm). The shaped body was placed in a sheath made of magnesia (size 90 mm square, height 50 mm), with 5 g of powder having the composition of $0.2Pb(Mg_{0.33}Nb_{0.67})O_3$-$0.35PbTiO_3$-$0.45PbZrO_3$ being allowed to coexist, and subjected to degreasing at 600° C. for 2 hours, and then firing was performed at 1,280° C. for 2 hours. Then, as in Example 1, a ceramic sheet used for a crystallographically-oriented ceramic was obtained. Furthermore, second inorganic particles were obtained as in Example 1 except that 0.5% by weight of NiO was added to the synthesized powder. Subsequently, in the shaping step/firing step of a crystallographically-oriented ceramic, the resulting ceramic sheet was crushed such that the aspect ratio was not less than or equal to 3. The first inorganic particles and the second inorganic particles were mixed so as to have the composition of $0.2Pb(Mg_{0.33}Nb_{0.67})O_3$-$0.35PbTiO_3$-$0.45PbZrO_3$ to which 0.5% by weight of NiO and 0.05% by weight of MgO were added. Then, as in Example 1, a slurry was prepared such that the viscosity was adjusted to 2,500 to 3,000 cP. As in Example 1, a crystallographically-oriented ceramic shaped body was formed, subjected to degreasing at 600° C. for 2 hours, and then fired at 1,280° C. for 3 hours. Thereby, a crystallographically-oriented ceramic of Example 2 was obtained.

Example 3

In the formation step of forming a ceramic sheet, a ceramic sheet used for a crystallographically-oriented ceramic was obtained as in Example 2 except that the composition, after grain growth, was set to be $0.2Pb(Mg_{0.33}Nb_{0.67})O_3$-$0.35PbTiO_3$-$0.45PbZrO_3$ to which 0.5% by weight of NiO and 1.0% by weight of MgO were added. Furthermore, second inorganic particles were obtained as in Example 1 except that 0.5% by weight of NiO was added to the synthesized powder. Subsequently, in the shaping step/firing step of a crystallographically-oriented ceramic, the resulting ceramic sheet was crushed such that the aspect ratio was not less than or equal to 3. The first inorganic particles and the second inorganic particles were mixed so as to have the composition of $0.2Pb(Mg_{0.33}Nb_{0.67})O_3$-$0.35PbTiO_3$-$0.45PbZrO_3$ to which 0.5% by weight of NiO and 0.1% by weight of MgO were added. Then, as in Example 2, a crystallographically-oriented ceramic of Example 3 was obtained.

Comparative Example 1

A crystallographically-oriented ceramic of Comparative Example 1 was obtained as in Example 1 except that the shaping step of crystallographically-oriented ceramic was carried out using only inorganic particles (non-oriented second inorganic particles) as raw material powder, without adding crystal grains, so that the composition of the fired crystallographically-oriented ceramic was $0.2Pb(Mg_{0.33}Nb_{0.67})O_3$-$0.35PbTiO_3$-$0.45PbZrO_3$ to which 1% by weight of NiO was added.

[X-ray Diffraction Measurement and Calculation of Degree of Orientation]

With respect to each of Example 1 and Comparative Example 1, an XRD pattern was measured when the crystal plane of the crystallographically-oriented ceramic was irradiated with X-ray using an XRD device (RINT TTRIII manufactured by Rigaku Corporation). The degree of orientation of the pseudocubic (100) plane was measured by the Lotgering method in which the degree of orientation was calculated according to the equation (1) described above using peaks of pseudocubic (100), (110), and (111) planes.

[Electron Microscopy]

Figure 3A:
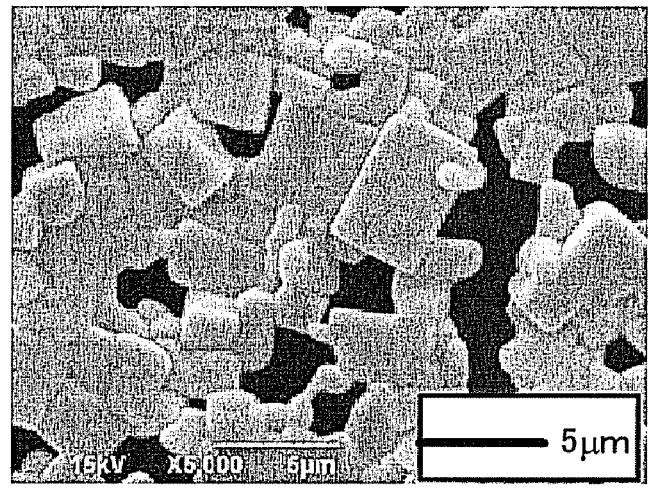
FIGS. 3A and 3B are each a SEM photograph of a ceramic sheet in Example 1.
Figure 3B:
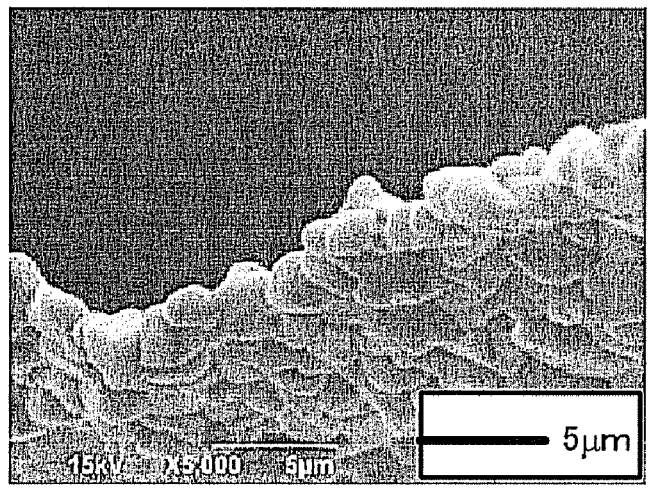
Figure 4:
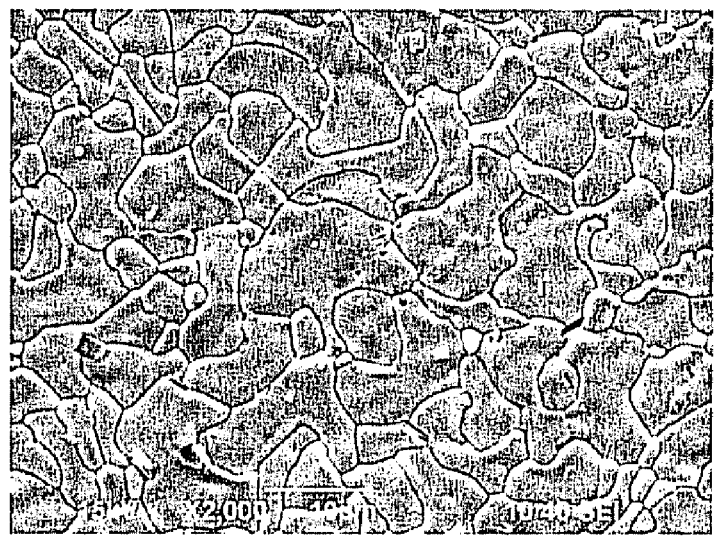
FIG. 4 is a SEM photograph of a ceramic sheet in Example 2.

With respect to the ceramic sheets of Examples 1 to 3, SEM photographs were taken using a scanning electron microscope (JSM-6390 manufactured by JEOL Ltd.). The SEM photographs of Example 1 are shown in FIGS. 3A and 3B, and the SEM photograph of Example 2 is shown FIG. 4. As shown in FIGS. 3A and 3B, in the ceramic sheet containing $Pb(Zr_{1-x}Ti_x)O_3$ as a main component, many crystal grains grown into a plate-like shape were confirmed. Furthermore, a cross section of the crystallographically-oriented ceramic of Example 1 was observed with a SEM, and a region which contained 50% by weight or more of Pb was mapped by EPMA. The area of a region containing 50% by weight or more of Pb occupying the crystal grain region excluding vacancies in the mapped region was determined as the "percent by volume of crystalline bodies containing 50% by weight or more of Pb". As a result, it was confirmed that the percentage of the crystals having $0.2Pb(Mg_{0.33}Nb_{0.67})O_3$-$0.35PbTiO_3$-$0.45PbZrO_3$ as the main component (crystals containing 50% by weight or more of Pb) was 98% by volume. Furthermore, with respect to the ceramic sheet of Example 2, as shown in FIG. 4, in the ceramic sheet containing $Pb(Zr_{1-x}Ti_x)O_3$ as a main component, many crystal grains grown with curved grain boundaries were confirmed. Furthermore, a cross section of the crystallographically-oriented ceramic of Example 2 was observed with a SEM, and mapping was performed by EPMA. The area of a region containing 50% by weight or more of Pb occupying the crystal grain region excluding vacancies in the mapped region was determined as the "percent by volume of crystalline bodies containing 50% by weight or more of Pb". As a result, it was confirmed that the percentage of the crystals having $0.2Pb(Mg_{0.33}Nb_{0.67})O_3$-$0.35PbTiO_3$-$0.45PbZrO_3$ as the main component (crystals containing 50% by weight or more of Pb) was 98.5% by volume. Furthermore, with respect to Example 3, the "percent by volume of crystalline bodies containing 50% by weight or more of Pb" was determined in the same manner. As a result, it was confirmed that the percentage of the crystals having $0.2Pb(Mg_{0.33}Nb_{0.67})O_3$-$0.35PbTiO_3$-$0.45PbZrO_3$ as the main component (crystals containing 50% by weight or more of Pb) was 98.2% by volume.

[Measurement of Electric-field-induced Strain]

With respect to each of Example 1 and Comparative Example 1, the crystallographically-oriented ceramic was machined into a size of 12 mm×3 mm×1 mm, and electrodes were formed on both surfaces of the resulting test piece by sputtering gold at a thickness of 500 μm. The test piece was immersed in silicone oil at 75° C. and polarized by applying a direct-current electric field of 2 kV/mm between the electrodes. Strain gauges (KFG type manufactured by KYOWA) were attached to both electrode surfaces after polarization, and amounts of strain in a direction perpendicular to the electric field were measured when an electric field of 4 kV/mm was applied. The average value between both electrode surfaces was defined as the electric-field-induced strain.

[Measurement Results]

The measurement results are shown in Table 1. In Example 1, the crystal orientation is high at a degree of orientation measured by the Lotgering method of 50%, and the electric-field-induced strain is high compared with the comparative example. Thus, it is evident that piezoelectric/electrostrictive properties are high. Furthermore, it is confirmed that a crystallographically-oriented ceramic with a high degree of orientation can be produced with a desired composition without adding an unnecessary component for enhancing the degree of orientation. Furthermore, in Examples 2 and 3, the degree of orientation and the electric-field-induced strain were higher. Thus, it is assumed that MgO added in excess not only increases the degree of orientation but also is precipitated as a heterogeneous phase without being incorporated into the crystal lattices. As is evident from the results, MgO is more preferred as an additive than the glass component from the standpoint that piezoelectric properties are not degraded.

TABLE 1

| Sample | Composition[1] | Degree of orientation[2] (%) | Electric-field-induced strain (ppm) |
|---|---|---|---|
| Example 1 | Basic Composition + 1.0 wt % NiO + 0.1 wt % glass | 50 | 1600 |
| Example 2 | Basic Composition + 0.5 wt % NiO + 0.05 wt % MgO | 70 | 1700 |
| Example 3 | Basic Composition + 0.5 wt % NiO + 1.0 wt % MgO | 85 | 1800 |
| Comparative Example 1 | Basic Composition + 1.0 wt % NiO + 0.1 wt % glass[3] | 0 | 1200 |

[1]Basic Composition: $0.2Pb(Mg_{0.33}Nb_{0.67})O_3$—$0.35PbTiO_3$—$0.45PbZrO_3$

[2]Degree of orientation in (100) plane measured by Lotgering method

[3]Produced without crystal grains

The present application claims priorities from Japanese Patent Application No. 2007-337721 filed on Dec. 27, 2007, Japanese Patent Application No. 2008-074427 filed on Mar. 21, 2008, Japanese Patent Application No. 2008-152099 filed on Jun. 10, 2008, and Japanese Patent Application No. 2008-303233 filed on Nov. 27, 2008, the entire contents of all of which are incorporated herein by reference.

What is claimed is:

1. A crystallographically-oriented ceramic comprising a plurality of crystalline bodies containing an oxide represented by general formula $ABO_3$ as a main component, the A site containing Pb, the B site containing at least two elements selected from the group consisting of Zr, Ti, Nb, Mg, Ni and Zn,
    wherein the crystallographically-oriented ceramic does not include crystalline bodies of $SrTiO_3$ or $BaTiO_3$;
    the plurality of crystalline bodies are oriented with specific crystal planes being aligned; and
    the degree of orientation of the crystalline bodies measured by the Lotgering method is 50% or more.

2. The crystallographically-oriented ceramic according to claim 1, wherein the crystallographically-oriented ceramic contains 85% by volume or more of crystalline bodies containing 50% by weight or more of Pb.

3. The crystallographically-oriented ceramic according to claim 1, wherein the crystallographically-oriented ceramic is used as a piezoelectric member and/or an electrostrictive member.

* * * * *